United States Patent [19]

Larson et al.

[11] Patent Number: 4,806,200
[45] Date of Patent: * Feb. 21, 1989

[54] METHOD FOR MANUFACTURE OF PRINTED CIRCUIT BOARDS

[75] Inventors: Gary B. Larson, Cheshire; Ann S. Williams, Southbury; Raymond A. Letize, West Haven, all of Conn.

[73] Assignee: MacDermid, Incorporated, Waterbury, Conn.

[*] Notice: The portion of the term of this patent subsequent to Aug. 18, 2004 has been disclaimed.

[21] Appl. No.: 132,761

[22] Filed: Dec. 14, 1987

Related U.S. Application Data

[62] Division of Ser. No. 875,640, Jun. 18, 1986, Pat. No. 4,732,649.

[51] Int. Cl.$^4$ ............................ C23F 1/00; B44C 1/22; C03C 15/00
[52] U.S. Cl. .................................. 156/652; 156/656; 156/666; 156/901; 29/847; 29/852
[58] Field of Search ............... 156/652, 656, 659.1, 156/661.1, 632, 666, 901, 902; 29/852, 846, 847; 427/96, 97; 174/68.5

[56] References Cited

U.S. PATENT DOCUMENTS

| | | | |
|---|---|---|---|
| 3,677,949 | 7/1972 | Brindisi | 156/666 |
| 4,127,438 | 11/1978 | Babcock | 156/666 |
| 4,144,118 | 3/1979 | Stahl | 156/901 |
| 4,409,037 | 10/1983 | Landau | 148/6.14 R |
| 4,487,654 | 12/1984 | Coppin | 156/666 |
| 4,687,545 | 8/1987 | Williams | 156/656 |

*Primary Examiner*—Kenneth M. Schor
*Attorney, Agent, or Firm*—St. Onge Steward Johnston & Reens

[57] ABSTRACT

A method of preparing printed circuit boards is described in which the solder mask is applied over a thin layer of copper oxide covering the copper circuit traces, the copper oxide layer being that which remains after stripping the tin or tin-lead alloy etch resist.

6 Claims, No Drawings

METHOD FOR MANUFACTURE OF PRINTED CIRCUIT BOARDS

This is a divisional of co-pending application Ser. No. 875,640, filed on June 18, 1986 and now U.S. Pat. No. 4,732,649.

BACKGROUND OF THE INVENTION

The present invention relates to printed circuit boards of the type having a solder mask over the copper circuit traces and, more particularly, to a method of manufacture of such circuit boards and to the unique printed circuit boards resulting therefrom.

As is well understood in the art, the manufacture of double-sided printed circuit boards requires the provision of conductive through-holes for interconnecting components on opposite sides of the board or, in the case of multilayer printed circuit boards, for interconnecting the inner layers. The non-conductive surfaces exposed when through-holes are drilled in a nonconductive substrate having metal cladding on both sides must, therefore, be provided with a conductive coating, and this generally is accomplished by a first electroless deposition of copper onto the suitably conditioned through-hole surfaces, followed by electroplating of copper to build up additional thickness.

In application of the actual circuit patterns to the metal-clad board surfaces, it is necessary to employ plating resists so as to prevent all but particular areas of the board (through-holes and/or traces and/or pads and/or other areas) from receiving applied metal platings such as the copper electroplate used in through-hole plating or the commonly-employed tin-lead coating applied as an etch-resist preliminary to the step of etching away undesired metal down to the non-conductive substrate surface so as to form the appropriate conductive circuit pattern and to ensure subsequent soldering of components.

Apart from its use as an etch-resist, tin-lead is a preferred overplating for otherwise exposed copper areas on the circuit board so as to prevent oxidative degradation of the copper surfaces.

In the ultimate fabrication of a printed circuit board in which various components and connections are soldered, it is generally accepted that improved solderability of circuit pads and through-holes can be provided to the ultimate fabricator by having the manfacturer precoat these areas with a solderable metal, generally a tin-lead composite closely similar in composition to the solder actually used in the eventual soldering of components and connections. For applications where hand-soldering by the fabricator is to be performed, little difficulty is encountered in applying solder to desired areas without disturbing or inadvertently soldering adjacent conductive traces. However, when soldering is to be conducted in mass techniques, such as with wave soldering or dip soldering methods, inadvertent soldering and improper connections can occur. As a consequence, manufacturers apply a solder resist or solder mask over those areas of the board to be protected from solder, including the tin-lead coated copper traces.

It has been recognized that the technique of solder resist over tin-lead coated copper can, however, lead to its own peculiar problems. For example, since the tin-lead is a reflowable metal, ultimate wave or dip soldering can cause the tin-lead to wick up under the mask or simply to melt and no longer provide support for the mask. Due to these disadvantages, it has been proposed to apply the solder mask directly over bare copper at those areas where protection from solder is desired. This "solder mask over bare copper" (SMOBC) technique avoids the problems inherent in the application of the mask over tin-lead coated copper, and can yield printed circuit boards with finer line definition and higher circuit density capabilities. Unfortunately, the known solder mask over bare copper techniques involve added manufacturing operations, and hence added cost, and present waste disposal and pollution control problems.

It has now been found that the above problems can be overcome or significantly reduced by applying the solder mask over a film of copper oxide on the surface of the copper layer to be protected. The copper oxide film is produced in situ on the copper layer in question using a novel process, to be described hereinbelow, for stripping of the tin-lead alloy etch resist employed in the earlier step of the process of fabricating a printed circuit board. Further, it is found that the application of the solder mask to copper covered with a film of copper oxide rather than to bare copper itself results in significantly increased strength of adhesion of the solder mask to the copper layer.

SUMMARY OF THE INVENTION

It is an object of the present invention to provide printed circuit boards of the type in which a solder mask is presently directly over a film of copper oxide on bare copper surfaces.

A further object of the invention is to provide a process for manufacturing boards of the type described in which solder mask is applied directly over a film of copper oxide produced in situ on copper circuit traces by a novel process for stripping tin-lead etch resist therefrom.

A more particular object of the invention is to provide printed circuit boards, and methods for their manufacture, of the type containing solder-coated pads and through-holes, and solder mask applied directly over a film of copper oxide coated on bare copper circuit traces.

The above objects, and other objects which will become apparent from the description which follows, are achieved by the process of the invention wherein the process of stripping the tin-lead etch resist prior to application of the solder mask is carried out using a two step process which leaves a thin film of copper oxide on the copper surface. Thereafter the solder mask is selectively applied over the whole board including at least the thin film of copper oxide on all trace surfaces other than the through-holes, surrounding pad surfaces and lands for attachment of surface mount devices and the like, if present all of which areas are hereinafter referred to as "loci to receive solder". As will be appreciated by one skilled in the art, there may be other areas or devices present on the board such as fingers and the like which are not to receive either solder mask or solder. In the interest of brevity, it will be assumed for purposes of the description which follows that, if such areas or devices are present, the appropriate steps conventionally employed in the art will be taken to prevent deposition of unwanted solder mask and or solder at these locations whether or not such steps are specifically mentioned. After the solder mask has been applied, the thin layer of copper oxide remaining exposed on the surface of the copper not protected by solder mask at the loci to receive solder is removed using an appropriate acid. The bare copper surfaces so exposed are then subjected to a soldering step to yield the finished circuit board.

The two step process of the invention, which is employed to steip the tin-lead alloy etch resist from the printed circuit board and leave a film of copper oxide on the underlying copper surfaces, is carried out as follows. The etch resist is subjected to the action of a first stripper composition comprising an oxidant for metals of said etch resist and an acceptor for the cation or cations so oxidized until only a thin film of tin residue remains on said substrate. This residue hereinafter "tin smut" is principally tin but may also contain small amounts of other components such as residual lead and or metal oxides. Thereafter the tin smut layer is subjected to the action of a second stripper composition comprising an aqueous solution containing a mixture of an alkali metal hydroxide and an alkali metal chlorite until said thin layer of tin smut has been replaced by a film of copper oxide.

The process of the invention has been discussed above in regard to the use of a tin-lead alloy as etch resist. The process of the invention can also be applied where tin rather than tin-lead alloy is employed as etch resist. The use of tin etch resists rather than tin-lead etch resists has the advantage of avoiding the need to dispose of waste products containing lead. The steps of the process of the invention are exactly the same whether the etch resist is tin or tin-lead alloy and it is to be understood that the invention is not limited to the use of tin-lead alone. However, in the interests of brevity, the further description will be directed to illustrating the invention as it applies to processes employing tin-lead as etch resist.

As will be readily apparent to one skilled in the art, the process of the invention is applicable not only to the manufacture of double sided printed circuit boards discussed above but also to other types of printed circuit boards including single sided boards, semi-additive type boards, molded boards, multilayer boards and the like. The invention will be illustrated hereinbelow by reference to the manufacture of double sided printed circuit boards but this is for purposes of illustration only and the scope of the present invention is not limited thereto.

DETAILED DESCRIPTION OF THE INVENTION

The method of the invention is carried out broadly in accordance with procedures and using materials conventionally employed in the art to fabricate printed circuit boards but with the exceptions that (i) the stripping of the tin-lead alloy etch resist is carried out using a two step process which leaves a thin film of copper oxide on the surface of the underlying copper circuit traces and loci to receive solder (ii) the solder mask is applied over the whole board including said thin film of copper oxide on the copper circuit traces but not over the copper oxide layer on the loci to receive solder and (iii) the copper oxide film on the latter locations is subsequently removed prior to the application of solder to the underlying copper at those locations.

Thus, in one embodiment, the method of the invention makes use of a conventional non-conductive substrate, containing through-holes and having a copper layer such as copper foil laminated on both sides of the substrate, generally in an amount to provide a coverage of about one ounce of copper per square foot (0.0014 inch thickness) on each side. The copper foil surfaces and the exposed non-conductive through-hole surfaces are then treated according to any known electroless copper depositing process (including the various conditioning, activating, accelerating, and rinsing steps involved in conditioning the surfaces and securing suitable deposition) to deposit a layer of copper thereon, generally of about 40 to $120 \times 10^{-6}$ inches in thickness.

Alternatively, the non-conducting substrate, without copper foil laminated thereto on both sides, can have a layer of copper plated directly thereon in accordance with the conventional semi-additive process.

A plating resist, which can be any of those conventionally employed in the art, is then applied to the copper surfaces. Such plating resists, including inks can be applied in the required pattern by stencil, screen printing or other known methods. Generally, the resist will be a photosensitive type (negative or positive-acting) and can be of the dry film or liquid type. Dry film resists will be employed where it is desired that certain throughholes receive no further coatings or other treatments, since the dry film will easily tent over and protect these holes. Preferably the resist will be a negative photoresist in which exposure to light results in insolubilizing of the resist material, while those areas not exposed to light remain in a form which permits dissolution and removal with a suitable developer. The loci to receive solder in a subsequent step are not protected with plating resist material. An electroplated copper coating is applied to these loci as well as to the pattern traces created in the photoresist (plating resist). Any of the known plating techniques and baths can be employed.

A tin-lead alloy etch resist is then applied, advantageously by known electroplating techniques, to the pattern traces, and loci to receive solder after which the plating resist is removed using techniques well-known in the art. The copper layers which had been covered by the plating resist is removed using techniques well-known in the art. The copper layers which had been covered by the plating resist are then etched away using standard techniques and using appropriate copper etchants to which the etch resist tin-lead coating is resistant.

It is the next step of the process wherein the present invention first departs from the conventionally employed procedures for fabricating printed circuit boards. Thus, instead of removing the tin-lead alloy etch resist completely and exposing bare copper in the circuit traces, and loci to receive solder, the stripping is carried out using a novel two step process as follows.

The first of the two steps of this stripping process is carried out using any of the stripper compositions hitherto employed in the art which leave a thin layer of tin smut on the copper thought to be due to redeposition of tin from the stripping bath or incomplete stripping. Such redeposition of tin can be avoided by replacing the stripping both at frequent intervals to prevent build up of tin therein but this adds significantly to the processing costs and is therefore undesirable. In order to remove this layer it has been necessary to employ very vigorous conditions using strongly oxidizing acids which can result in undesirable loss of copper from the underlying copper. In accordance with the process of the invention the thin layer of tin is removed using a second stripper composition as described below thereby avoiding attack on the underlying copper.

The stripper compositions employed in this first step of the process generally contain an oxidant for the tin and lead components and an acid acceptor for the cations so oxidized. The principal type of such stripper composition is based on a combination of a nitro-substituted aromatic compound such as nitro-substituted aromatic sulfonic acids and salts thereof and an acid such as fluoboric, acetic or like aliphatic acids or aromatic acids. The nitro-aromatic compounds are oxidants for the tin-lead and the other acid is an acceptor for the cations so oxidized. Illustrative of such compositions are those disclosed in U.S. Pat. Nos. 3,677,949; 4,004,956; 4,397,753; and 4,439,338.

The nitro-substituted aromatic compound can be any aromatic compound having one or more nitro-substituents on the aromatic ring and having a water-solubilizing substituent also attached to the aromatic ring. Illustrative of such compounds are o-, m- and p-nitrobenzene sulfonic acids and alkali metal salts thereof; o-, m- and p-nitrobenzoic acids and alkali metal salts thereof; o-, m- and o-nitrochloro benzenes, o-, m- and p-nitrophenols; and o-, m- and p-nitroanilines and mineral acid salts thereof. A preferred group of nitro-substituted aromatic compounds are the nitrobenzene sulfonic acids and alkali metal salts thereof. A particularly preferred such compound is sodium m-nitrobenzene sulfonate.

The acids employed in association with the nitro-aromatic compounds can be any of those which are capable of readily reacting with tin and lead to form water-soluble salts but which do not form a water-insoluble film on the tin or tin-lead alloy being stripped. Illustrative of such acids are fluoboric and fluosilicic acids and sulfamic acid.

Optionally, but preferably, there is also present in the above stripper compositions an organic acid such as formic, acetic, propionic, chloroacetic, bromoacetic, trichloroacetic acids and the like which act as accelerators in enhancing the rate of stripping.

The various components of the stripping composition are present advantageously in proportions within the following ranges:

| | |
|---|---|
| nitroaromatic compound: | 30 to 120 g. per liter |
| inorganic acid: | 50 to 200 g. per liter |
| organic acid: | 25 to 100 g. per liter |
| water: | to make 1 liter. |

This first stripping step is most conveniently accomplished by immersing the circuit board in a bath of the stripper composition. The latter is preferably heated or pre-heated to a temperature within the range of about 20° C. to about 70°, and preferably to a temperature within the range of about 25° C. to about 60° C. When the point has been reached at which a layer of tin smut remains on the surfaces previously protected by erch resist, the substrate is removed from the stripper bath and subjected to a water rinse before being treated in accordance with the second step of the stripping process.

The stripper composition employed in the second step comprises an aqueous solution containing as the principal active ingredients a mixture of an alkali metal hydroxide and an alkali metal chlorite. Any of the alkali metal hydroxides and chlorites can be used in any combination. However, a particularly preferred combination comprises a mixture of sodium hydroxide and sodium chlorite. The alkali metal hydroxide is advantageously employed in a concentration within the range of about 10 to about 200 grams per liter, and, preferably, in the range of about 100 to about 200 grams per liter. The alkali metal chlorite is advantageously employed in a concentration within the range of about 5 grams per liter to about saturation and, preferably, in the range of about 50 to about 150 grams per liter.

The second stripping step is conveniently carried out by immersing the circuit board, recovered from the first stripping step, in a bath of the second stripper composition. The latter is preferably heated or preheated to a temperature within the range of about 20° C. to about 100° C., and, most preferably, to a temperature within the range of about 50° C. to about 100° C. The progress of the removal of the tin smut layer can be followed by visual inspection the end point being signalled by a change in color of the surface of the substrate from the brown-gray of the tin smut film to a dark brown or black color due to formation of a film of copper oxide. When this stage is reached, generally within a period of a few minutes, the substrate is removed from the bath, rinsed with water and a neutralizing solution to remove last traces of the stripper solution, and finally dried. Thereafter a layer of solder mask is selectively applied to the board including the film of copper oxide on the copper circuit traces but not over the loci to receive solder. Any of the known solder masks can be used and applied in accordance with standard techniques such as screen printing and the like.

In the penultimate step of the invention, the copper oxide film remaining over the copper layer of the loci to receive solder is removed to expose bare copper at these locations. This is accomplished by exposing the circuit board to the action of aqueous acid, such as aqueous sulfuric acid, for a very brief period sufficient to expose bare, clear copper at the above location. This step is carried out conveniently by dipping the board into a bath of the aqueous acid at or about ambient temperature (70° F.).

In an optional step the clean copper surface so produced is coated with an organic protective coating such as that available under the trade name SEALBRITE, available from London Chemical Company, to protect the copper layer from oxidation by contact with air prior to the soldering step. In the latter step the solder can be applied directly over the coating without removing the latter.

The final step of the process of the invention comprises applying solder to the loci to receive it using conventional techniques such as immersion or plating followed by the known hot air level procedure.

The process of the invention gives rise to a number of advantages in terms of the actual process and the properties of the circuit board produced thereby. Thus, the copper oxide film serves to promote improved adhesion between the solder mask and the underlying copper circuit traces. Also the copper serves to obviate or significantly reduce the problems noted previously which can arise when solder mask is used over copper traces covered with tin-lead.

The procedure of the invention possesses a number of other benefits which will be apparent to one skilled in the art. Illustratively, if there is to be any significant interval of time between the step of applying the solder mask and the step of applying solder to the through-holes and pads, the circuit board can be stored after application of the solder mask and the thin film of copper oxide on the through-holes and pads is not removed until immediately before applying the solder. In this way the oxidation of copper surface, which would occur if copper oxide coating were to be removed and the resulting circuit board stored before application of the solder, is avoided very neatly. Other such benefits will be readily apparent to one skilled in the art.

The following example describes the manner and process of making and using the invention and sets forth the best mode presently contemplated by the inventors of carrying out the invention but is not to be construed as limiting.

EXAMPLE

A printed circuit board was prepared in accordance with the process of the invention in the following manner.

An epoxy resin sheet having copper foil laminated to both sides thereof and having through-holes made therein has a copper layer electrolessly deposited on the foil surfaces and through-hole and surrounding pad surfaces using standard techniques. Thereafter a resist image of a trace pattern is produced on the copper layers on both sides of the board using a negative photoresist [RISTON; DuPont-Company] and, after exposure, developing the image using aqueous sodium bicarbonate solution. Additional copper is then deposited on the circuit traces and through-holes and surrounding pads by electroplating using conventional processes. Tin-lead alloy etch resist is then applied using conventional techniques to the circuit traces, through-holes and pads and thereafter the photoresist is dissolved from the board. The copper layer thereby exposed is etched away using a standard etchant solution thereby leaving the circuit traces, through-holes and pads protected by the etch resist.

The circuit board is then immersed in a stripper bath obtained by dissolving 150 grams of sodium m-nitrobenzene sulfonate, 200 grams of fluoboric acid and 50 grams of acetic acid in sufficient water to make 1000 mls of solution. The bath has previously been heated to 140° C. The board is kept in the bath until the blue-gray color of the tin-lead alloy is replaced by the brown-gray color of a "smut" film of tin. Total immersion time is about 10 minutes. The resulting board is rinsed with water and immersed in an aqueous solution containing 100 grams per liter of sodium chlorite and 200 grams per liter of sodium hydroxide maintained at 95° C. After about 6 minutes of immersion the color of the metal surface of the copper substrate changes from a brown-gray to the clear light brown color of copper oxide. The board is then rinsed with water and a neutralizing rinse (some monovalent red oxide is produced thereby) and dried before applying solder mask, using conventional techniques, to the copper oxide-coated circuit traces but not to the through-holes and pads. The copper oxide layer on the latter locations is then removed by immersing the board briefly (about 60 seconds) in a 10 percent by weight aqueous sulfuric acid bath until the underlying copper surfaces appear clean and bright. The board is rinsed, dried, immersed in a solder bath to apply solder to the through-holes and pads, and finally subjected to a standard hot air leveling procedure.

What is claimed is:

1. In a method for manufacturing printed circuit boards the steps comprising:
   (a) providing a circuit board material containing through-holes and pads surrounding the surface openings of said through-holes, said board consisting of a non-conductive substrate material having copper foil laminated to each side thereof, the areas defined by said through-holes consisting of layered coatings extending radially inward toward the center of said holes, the layers being, sequentially from the wall of each electroless copper, electroplated copper and etch resistant electroplated tin-lead, the areas defined by said pads consisting of layered coatings, commencing from said copper foil on the non-conductive substrate surface, of electroless copper, electroplated copper and etch resistant electroplated tin-lead, and said non-conductive substrate having a trace pattern on at least one surface of said non-conductive substrate consisting of layered coatings, commencing from said substrate surface, of copper foil, electroless copper, electroplated copper and etch resistant electroplated tin-lead;
   (b) etching away all copper from the areas of said circuit board not provided with said etch resistant tin-lead layer;
   (c) subjecting said tin-lead etch resist to the actio of a first stripper composition comprising an oxidant for the tin and lead metals of said etch resist and an acid acceptor for the cations so oxidized to leave a thin film of tin smut on said trace pattern, through-holes and surrounding pad surfaces;
   (d) subjecting said thin film of tin smut to the action of a second stripper composition comprising an aqueous solution containing a mixture comprising an alkali metal hydroxide and an alkali metal chlorite until said thin film of tin smut has been removed and replaced by a layer of copper oxide;
   (e) applying a solder mask to the said trace pattern which has said layer of copper oxide on it, but not to said through-holes and surrounding pad surfaces;
   (f) etching away said thin film of copper oxide from said through-holes and surrounding pad surfaces; and
   (g) applying solder to said through-holes and pads.

2. A process according to claim 1 wherein said first stripper composition comprises an aqueous solution comprising fluoboric acid and a member selected from nitro-substituted aromatic sulfonic acids and alkali metal salts thereof.

3. A process according to claim 2 wherein said nitro-substituted aromatic sulfonic acid is m-nitrobenzene sulfonic acid and said first stripper composition also comprises acetic acid.

4. A process according to claim 1 wherein said second stripper composition comprises a mixture of sodium hydroxide and sodium chlorite.

5. A process according to claim 1 wherein said step (f) is accomplished by exposing said layer of copper oxide to the action of aqueous acid.

6. A process according to claim 5 wherein said aqueous acid is aqueous sulfuric acid.

* * * * *